United States Patent [19]

Ikegaya et al.

[11] Patent Number: 4,675,206

[45] Date of Patent: Jun. 23, 1987

[54] PROCESS FOR THE PRODUCTION OF A SURFACE-COATED ARTICLE

[75] Inventors: Akihiko Ikegaya; Masaaki Tobioka, both of Itami, Japan

[73] Assignee: Sumitomo Electric Industries, Ltd., Osaka, Japan

[21] Appl. No.: 849,523

[22] Filed: Apr. 8, 1986

[30] Foreign Application Priority Data

Apr. 19, 1985 [JP] Japan .................................. 60-84852
May 2, 1985 [JP] Japan .................................. 60-95157

[51] Int. Cl.$^4$ ............................................ B05D 3/06
[52] U.S. Cl. .................................................... 427/38
[58] Field of Search ..................................... 427/38–40

Primary Examiner—Bernard D. Pianalto

Attorney, Agent, or Firm—Wenderoth, Lind & Ponack

[57] ABSTRACT

A surface-coated article or part, for example, hard material-coated steels or cemented carbides for cutting tools, wear resisting tools, sliding parts or decoration articles, having good properties comparable to those obtained by the PVD method, can be produced by a plasma CVD method characterized by using jointly a high frequency source and a direct current source as a plasma exciting source, holding a substrate or base metal at a negative potential by the direct current source and adjusting a high frequency power density applied to a plasma-forming space to 0.01 to 1 W/cm$^3$, an absolute value of a direct current voltage to at most 1500 V and a gaseous atmosphere pressure to 0.05 to 5 Torr.

5 Claims, No Drawings

PROCESS FOR THE PRODUCTION OF A SURFACE-COATED ARTICLE

BACKGROUND OF THE INVENTION

1. Field of the Invention

This invention relates to a process for surface-coating base metals and more particularly, it is concerned with a process for surface-coating steels or cemented carbides for tools or parts with hard materials or chemically stable materials by the plasma CVD method.

2. Description of the Prior Art

Up to the present time, tools or parts have been coated with titanium carbide or titanium nitride for the purpose of improving the wear resistance, heat resistance and corrosion resistance thereof. In particular, cutting tools consisting of cemented carbides, as substrates, coated with hard coating layers have lately been generalized. Typical of the coating methods are CVD methods and PVD methods and in cutting tools, in particular, the CVD method has played a most important part. Since the CVD method employs a higher coating temperature, e.g. 1000° C., in general, a substrate or base material of steel is annealed and thus it is required to effect quenching and tempering after coating. Accordingly, there take place cracking, flaking-off and change of the dimension in a coating layer and it is difficult to produce an article having a good precision in stable manner. In the CVD method, furthermore, a decarburization phenomenon sometimes occurs in a substrate during the reactions and in such a case, it is very difficult to form a coating layer without deteriorating the substrate.

In the PVD method, on the other hand, the above described problems have been solved since formation of a coating layer is possible even at a lower temperature, e.g. 600° C. or lower, so annealing or decarburization of a substrate does not occur. Moreover, a sufficient bonding strength of a substrate and coating layer has been obtained by various improvements even if the coating is carried out at a lower temperature and consequently, the PVD method has held an important position in processes for the production of coated steels. However, the PVD method is inferior to the CVD method in respect of that in the former method using a high vacuum, the installation cost is higher, the resulting coating has a directional property, a revolving mechanism is required because of the lower deposition efficiency and the producibility is remarkably lower, thus resulting in a higher processing cost. In addition, coating of a part having a complicated profile is difficult because of the lower uniformity of the coating layer thickness.

In the case of coating cemented carbides by the CVD method, the strength of the cemented carbide substrates is lowered after the coating, so that the edges tend to break under severer cutting conditions, for example, in heavy cuttings and the lives are not so lengthened. Therefore, the CVD method is not suitable as a coating method of a tool for heavy cutting. On the other hand, the PVD method has advantages that the strength of a substrate is not lowered, the edge is hardly broken even in heavy cutting and the coating layer can exhibit the intrinsic effect of preventing a workpiece from adhesion to the surface of a tool, thus lengthening the tool life. However, the PVD method has also disadvantages that the installation cost is higher, a special mechanism for revolving a substrate is required because of the lower uniformity of the coating layer thickness and the reproducibility is remarkably lower than in the CVD method, thus resulting in a greater processing cost.

SUMMARY OF THE INVENTION

It is an object of the present invention to provide a process for surface-coating a substrate by a plasma CVD method.

It is another object of the present invention to provide hard material-coated steels for cutting tools, wear resisting tools, sliding parts or decoration articles with a lower cost as compared with the PVD method.

It is a further object of the present invention to provide a surface-coated steel part with a complicated profile.

It is a still further object of the present invention to provide a surface-coated cemented carbide resisting to heavy cutting with a lower cost.

These objects can be attained by a process for surface-coating steel or cemented carbide comprising forming a hard coating layer on a surface of a substrate by a plasma CVD method, characterized in that the forming of the hard coating layer is carried out by using jointly a high frequency source and a direct current source as a plasma exciting source and holding the substrate at a negative potential by the direct current source under the following conditions (1) to (3):

(1) a power density of the high frequency source: 0.01 to 1.0 $W/cm^3$;

(2) an absolute value of voltage of the direct current source: at most 1500 V;

(3) a pressure of a gaseous atmosphere: 0.05 to 5 Torr

DETAILED DESCRIPTION OF THE INVENTION

The inventors have noted a plasma CVD method as a coating method which has an advantage, i.e. resulting in a uniformity of a coating film thickness, characteristic of the CVD method, and can lower the coating temperature, have made various studies on means for lowering the coating temperature and consequently, have found that formation of a coating film cannot effectively be accomplished unless the coating temperature and plasma strength, defined by a power introduced into a plasma-forming space, are within constant ranges. In the plasma CVD method, however, the adhesion between a substrate and coating film is also lowered if the coating temperature is low and increase of the adhesion has thus been desired so as to use the coated substrate as a cutting tool or wear resisting coated part. Accordingly, the inventors have made various effects to develop a process for surface-coating by the plasma CVD method at a low temperature without lowering the adhesion and have thus achieved the following surprising knowledge. That is, remarkable improvements of properties can be obtained in, for example, coated steel tools or coated wear resisting steel parts by the plasma CVD method comprising using jointly a high frequency source and a direct current source as a plasma exciting source, holding a steel substrate at a negative potential by the direct current source and adjusting the high frequency power density introduced into a plasma forming space to 0.01 to 1 $W/cm^3$, the absolute value of the direct current voltage to 1500 V or less, preferably 1-1500 V and the pressure of a gaseous atmosphere to 0.05 to 5 Torr.

Furthermore, the inventors have noted that a cemented carbide meets with lowering of the strength after coating by the CVD method, have made studies for lowering the coating temperature so as to prevent from the lowering of the strength and consequently, have achieved the following knowledge:

(1) If the coating temperature is lowered, the strength of a cemented carbide substrate after coating is lowered to a decreased extent and the breakage resistance is improved.

(2) The plasma CVD method is suitable as a method capable of lowering the coating temperature while making the best use of the feature of the CVD method capable of resulting in a uniformity of a coating layer thickness.

(3) For the purpose of lowering the coating temperature and forming a coating layer resistant to use as a surface-coated cemented carbide, it is required to adjust the coating temperature and plasma intensity defined by a power applied to a plasma forming space to predetermined ranges.

(4) It is known that the strength of a coated cemented carbide depends on the coating temperature and the lower the coating temperature, the lower the adhesion of the coating layer. If noting only the strength of a coated cemented carbide, therefore, it is desirable to lower the coating temperature as lower as possible within such a range that the coating layer is formed, but if the coating temperature is too lowered, the adhesion of the coating layer to the cemented carbide substrate is so weak that the coating layer tends to flake off and the coated cemented carbide cannot resist use as a cutting tool. That is to say, there are limits as a matter of course in improvements relating to the cutting property by lowering the coating temperature.

Accordingly, the present invention provides a process for coating a substrate such as steels or cemented carbides by a plasma CVD method, which comprises using jointly a high frequency source and a direct current source as a plasma exciting source, holding the substrate at a negative potential by the direct current source and adjusting a power density of the high-frequency source to 0.01 to 1 $W/cm^3$, an absolute value of voltage of the direct current source to at most 1500 V and a pressure of the gaseous atmosphere to 0.05 to 5 Torr. The coating is generally carried out at a temperature of 300° to 1100° C., more preferably 400° to 900° C.

In the present invention, in particular, a RF wave source is preferably used as the high frequency source and a substrate can be held at a negative potential in any case of positioning at an insulated place from the high frequency source, connecting to a pole at the leading-in side of the high frequency source or connecting to another pole at the earthing side thereof.

According to the process of the present invention, there can be produced tools or parts the surface of which is coated with at least one layer consisting of at least one compound of at least one element selected from the group consisting of Group IVa, Va and VIa transition metals of Periodic Table, Si, Al and B and at least one element selected from the group consisting of B, C, N and O. Generally, the thickness of the coating layer ranges from 2 to 10μ. The thus produced tools or parts each have an improved wear resistance, heat resistance and corrosion resistance and are suitable for use as cutting tools such as cutters, wear resistant tools such as metallic molds or wire drawing dies, sliding parts such as bearings or cams and decoration articles such as watch cases.

The reason for using a high frequency source as a plasma exciting is as follows: When a plasma is formed by discharge of feed gases for a coating layer or a carrier gas, chemically activated species are more readily formed by plasma excitation using high frequency sources, in particular, RF wave source than by excitation using a direct current source, and moreover, it is possible to form and hold a stable plasma for a gaseous atmosphere pressure or power output within a wide range and for various electrode structures. Thus, the plasma excitation by a high frequency source is essential for the present invention.

The reason for holding a substrate at a negative potential is as follows: A plasma is formed by discharge of feed gases or a carrier gas by high frequency excitation and the ionized or activated feed gases are subjected to chemical reaction on the surface of the substrate to form a hard coating layer, during which positive ions taking part in the chemical reaction are preferentially attracted to the surface of the substrate by holding the substrate at a negative potential by a direct current source. During the same time, two cases are taken into consideration where a substrate is on a position isolated and insulated from a high frequency source and where a substrate is connected with a pole either at the leading-in side or the earthing side of a high frequency source. Any case will do.

The reason for adjusting a power density applied to a space forming space to 0.01 to 1.0 $W/cm^3$ is as follows: In a plasma CVD method, the intensity of a plasma depends on a gaseous atmosphere, discharging system, shape or structure of a discharging electrode and output of a plasma exciting source. Since the intensity of a plasma can more readily be varied in a wide range by changing the output of a plasma exciting source, of these factors, it is convenient to control the intensity of a plasma by the output of an exciting source. The intensity of a plasma is varied depending on the shape or structure of a discharging electrode even if a same output is applied and accordingly, it is desirable to represent the intensity of a plasma by a power applied from an exciting source per unit volume of a plasma-forming space.

If the power density is less than 0.01 $W/cm^3$, it is impossible to form a coating layer, while if more than 1.0 $W/cm^3$, the coating process is adversely affected by an ion sputtering phenomenon and it is expensive to install a large output source capable of applying such a large power density, which is disadvantageous from a commercial viewpoint.

The reason for adjusting a pressure of a gaseous atmosphere to 0.05 to 5 Torr is as follows: If the pressure of a gaseous atmosphere is lower than 0.05 Torr, the mean free path becomes so long that vapor deposition has a directional property which is not favourable from a viewpoint of uniform coating, while if higher than 5 Torr, it is difficult to hold a plasma in stable manner.

The reason for adjusting an absolute value of a negative potential applied to a substrate by a direct current source to at most 1500 V is as follows: If the absolute value of a negative potential is larger than 1500 V, an abnormal discharge occurs locally and a stable discharge cannot be held.

According to the process for surface-coating a substrate such as of steels or cemented carbides of the present invention, the adhesion of layers and breakage resistance of tools surface-coated by the plasma CVD method can markedly be improved and cutting properties comparable to those of tools coated by the PVD method can be obtained. In addition, the coating process can be carried out with a lower cost.

The following examples are given in order to illustrate the present invention in greater detail without limiting the same.

EXAMPLE 1

A high speed steel (material quality SKH 57, $H_RC=65.1$) was machined into Form No: SNGN 432 and coating the surface thereof with a TiC layer with a thickness of $4\mu$ was carried out under conditions as shown in Table 1 by using a plasma CVD apparatus with excitation by a RF wave source of 13.56 MHz and holding the steel substrate at a negative potential by a direct current source. Consequently, coating films of TiC were obtained as to Sample Nos. 1, 2, 3, 6, 7, 8 and 9. The thus obtained coated inserts and an ordinary insert A for comparison, consisting of a high speed steel coated with TiC by the PVD method, were subjected to a cutting test under cutting conditions shown in Table 2.

After cutting for 40 minutes, the flank wear widths of these samples were:

Insert A: 0.20 mm
Sample No. 1: 0.26 mm
Sample No. 2: 0.19 mm
Sample No. 3: 0.17 mm
Sample No. 6: 0.32 mm
Sample No. 7: 0.22 mm
Sample No. 8: 0.20 mm
Sample No. 9: 0.28 mm As evident from these results, the tools of the plasma CVD coated steels according to the present invention has properties sufficiently comparable to those of the tool of the PVD coated steel.

TABLE 1

| Sample No. | Gaseous Atmosphere (Torr) | Coating Temperature (°C.) | High Frequency Power Density (W/cm³) | Direct Current Voltage (V) | Remarks |
| --- | --- | --- | --- | --- | --- |
| 1 | 1 | 550 | 0.10 | −400 | |
| 2 | 1 | 550 | 0.10 | −800 | |
| 3 | 1 | 550 | 0.10 | −1200 | |
| 4 | 1 | 550 | 0.10 | −1600 | impossible to hold stable plasma |
| 5 | 1 | 550 | 0.005 | −200 | no film formation |
| 6 | 1 | 550 | 0.03 | −200 | |
| 7 | 1 | 550 | 0.06 | −600 | |
| 8 | 1 | 550 | 0.15 | −600 | |
| 9 | 3 | 550 | 0.10 | −600 | |
| 10 | 6 | 550 | 0.10 | −600 | impossible to hold stable plasma |

TABLE 2

| | Cutting Conditions |
| --- | --- |
| Workpiece | SCM 3 200 mm (diameter) × 500 mm (length) |
| Cutting Speed | 40 m/min |
| Feed | 0.36 mm/rev |
| Cutting Depth | 2.0 mm |
| Holder | FN 11 R −44 A |

EXAMPLE 2

A high speed steel (material quality SKH 57, $H_RC=65.1$) was machined into Form No. SNGN 321 and coating of the surface thereof with a TiN layer with a thickness of $3\mu$ was carried out under conditions as shown in Table 3 by using the same plasma CVD apparatus as that of Example 1 in an analogous manner to Example 1. Consequently, TiN coating layers were obtained in any of these conditions. The thus obtained coated inserts and an ordinary insert B for comparison, consisting of a high speed steel coated with TiN by the PVD method, were subjected to a cutting test under cutting conditions shown in Table 4.

After cutting for 30 minutes, the flank wear widths of these samples were:

Insert B: 0.100 mm
Sample No. 11: 0.126 mm
Sample No. 12: 0.115 mm
Sample No. 13: 0.112 mm
Sample No. 14: 0.101 mm
Sample No. 15: 0.093 mm
Sample No. 16: 0.082 mm

TABLE 3

| Sample No. | Gaseous Atmosphere (Torr) | Coating Temperature (°C.) | High Frequency Power Density (W/cm³) | Direct Current Voltage (V) |
| --- | --- | --- | --- | --- |
| 11 | 1 | 500 | 0.04 | −600 |
| 12 | 1 | 500 | 0.06 | −600 |
| 13 | 1 | 500 | 0.08 | −600 |
| 14 | 1 | 500 | 0.10 | −600 |
| 15 | 1 | 500 | 0.08 | −900 |
| 16 | 1 | 500 | 0.08 | −1200 |

TABLE 4

| | Conditions |
| --- | --- |
| Workpiece | SCM 3 |
| Cutting Speed | 30 m/min |
| Feed | 0.17 mm/rev |
| Cutting Depth | 2.0 mm |
| Cutter | DNF 4160 R |

Example 3

A stainless steel of SUS 304 was subjected to a boride forming treatment with a total hardened thickness of 0.3 mm and a surface hardness of Hv 2200 by a solid boride forming method and then to buffing to prepare a watch frame with a finished specular surface, and coated with a TiN layer with a thickness of $10\mu$ using the same plasma CVD apparatus as that of Example 1 under conditions of a gaseous atmosphere pressure of 1.0 Torr, coating temperature of 500° C., high frequency power density of 0.08 W/cm³ and direct current voltage of −800 V.

When the thus obtained TiN-coated watch frame and another watch frame for comparison, coated with TiN by the ordinary PVD method, were subjected to an artificial sweat test at 35° C. for 100 hr and a brine spraying test at 35° C. for 100 hr, there was found no corrosion in both the tests.

EXAMPLE 4

The hole of a metallic mold for deep drawing (made of SKD 11, 10 mm diameter × 30 mm depth) was coated wholly with a TiN layer with a thickness of $2\mu$ in an analogous manner to Example 1.

When a SUS 304 sheet of 0.5 mm in thickness was subjected to deep drawing using this metallic mold, there was hardly found wear for 23,800 shots, while using a non-treated metallic mold, only 16,900 shots were processed due to wearing.

When the coating was carried out by ion plating method, the hole of 30 mm in depth was not uniformly coated and accordingly, only 20,024 shots were processed.

EXAMPLE 5

A commercially available cemented carbide ISO P-30 (commercial name, Form No. SPCH 42 TR) was used as a substrate and subjected to a coating treatment of a TiC layer with a thickness of $2\mu$ under conditions shown in Table 5 using a RF wave of 13.56 MHz as an exciting source according to the present invention.

As evident from Table 5, TiC coating layers were obtained as to Sample Nos. 2 to 7 and 9 and there was found no layer formed as to Sample No. 1. As to Sample Nos. 8 and 9, it was so difficult to hold stably the plasma that a good coating was not obtained.

The thus obtained coated inserts were fitted to cutters and subjected to a cutting test under conditions shown in Table 6, during which a commercially available PVD-coated insert for comparison (commercial name AC 330 manufactured by Sumitomo Electric Industries, Ltd.) was subjected to a cutting test under the same conditions as described above.

As result of the above described cutting tests, any inserts did not meet with breakage of the edges when the cutting had been carried out for 12 minutes. After cutting for 12 minutes, the comparative PVD-coated insert showed a flank wear width of 0.070 mm, while the samples of the present invention showed the following flank wear widths:

Sample No. 2: 0.131 mm
Sample No. 3: 0.103 mm
Sample No. 4: 0.111 mm
Sample No. 5: 0.093 mm
Sample No. 6: 0.074 mm
Sample No. 7: 0.065 mm
Sample No. 9: 0.146 mm

EXAMPLE 6

A commercially available cemented carbide ISO P-30 (commercial name, Form No. SNMN 432) was used as a substrate and subjected to a coating treatment of a TiN or Ti(CN) layer with a thickness of $2\mu$ under conditions shown in Table 7 using a RF wave of 13.56 MHz according to the present invention.

As evident from Table 7, coating layers could be obtained in any case. The thus obtained coated inserts were fitted to a cutter and subjected to a cutting test under conditions shown in Table 8, during which a commercially available PVD-coated insert for comparison (commercial name AC 330 manufactured by Sumitomo Electric Industries, Ltd.) was subjected to a cutting test under the same conditions as described above.

As a result of the above described cutting tests, any inserts did not meet with breakage of their edges when the cutting had been carried out for 20 minutes. After cutting for 20 minutes, the comparative PVD-coated insert showed a flank wear width of 0.095 mm, while the samples of the present invention showed the following flank wear widths:

Sample No. 11: 0.138 mm
Sample No. 12: 0.132 mm
Sample No. 13: 0.126 mm
Sample No. 14: 0.116 mm
Sample No. 15: 0.102 mm
Sample No. 16: 0.112 mm
Sample No. 17: 0.100 mm
Sample No. 18: 0.093 mm
Sample No. 19: 0.116 mm
Sample No. 20: 0.090 mm It is apparent from the above described comparisons that the process of the present invention can give coating layers comparable to those obtained by the PVD method.

TABLE 5

| Sample No. | Gaseous Atmosphere (Torr) | Coating Temperature (°C.) | High Frequency Power Density (W/cm³) | Direct Current Voltage (V) | Remarks |
|---|---|---|---|---|---|
| 1 | 1 | 650 | 0.008 | −200 | no layer formation |
| 2 | 1 | 650 | 0.02 | −200 | |
| 3 | 1 | 650 | 0.04 | −500 | |
| 4 | 1 | 650 | 0.08 | −300 | |
| 5 | 1 | 650 | 0.08 | −500 | |
| 6 | 1 | 650 | 0.08 | −800 | |
| 7 | 1 | 650 | 0.08 | −1200 | |
| 8 | | 650 | 0.08 | −1600 | impossible to hold stable plasma |
| 9 | 3 | 650 | 0.10 | −500 | |
| 10 | 6 | 650 | 0.10 | −500 | impossible to hold stable plasma |

TABLE 6

| | Conditions |
|---|---|
| Workpiece | SCM 435 (Hs 38) 200 mm (length) × 100 mm (width) |
| Cutting Speed | 200 mm/min |
| Feed | 0.20 mm/t |
| Cutting Depth | 2.0 mm |
| Cutter | Form No. DPG 4160 R (made by Sumitomo Electric Industries, Ltd.) |

TABLE 7

| Sample No. | Coating Layer | Gaseous Atmosphere (Torr) | Coating Temperature (°C.) | High Frequency Power Density (W/cm³) | Direct Current Voltage (V) |
|---|---|---|---|---|---|
| 11 | TiN | 1 | 500 | 0.04 | −500 |
| 12 | TiN | 1 | 500 | 0.06 | −500 |
| 13 | TiN | 1 | 500 | 0.08 | −500 |
| 14 | TiN | 1 | 500 | 0.08 | −800 |
| 15 | TiN | 1 | 500 | 0.08 | −1000 |
| 16 | Ti(CN) | 1 | 600 | 0.06 | −500 |
| 17 | Ti(CN) | 1 | 600 | 0.06 | −800 |
| 18 | Ti(CN) | 1 | 600 | 0.06 | −1000 |
| 19 | Ti(CN) | 1 | 600 | 0.08 | −500 |
| 20 | Ti(CN) | 1 | 600 | 0.08 | −1000 |

TABLE 8

| | Conditions |
|---|---|
| Workpiece to be Cut | SCM 435 (Hs 40) |
| Cutting Speed | 200 mm/min |
| Feed | 0.20 mm/t |
| Cutting Depth | 2.0 mm |
| Cutter | Form No. DNF 4160 R (made by Sumitomo Electric Industries, Ltd.) |

What is claimed is:
1. A process for the production of a coated article by coating a substrate with a hard or chemically stable material using a plasma CVD method, which comprises using jointly a high frequency source and a direct current source as a plasma exciting source, holding the substrate at a negative potential by the direct current source and adjusting a high frequency power density applied to a plasma-forming space to 0.01 to 1 W/cm$^3$, an absolute value of a direct current voltage to at most 1500 V and a gaseous atmosphere pressure to 0.05 to 5 Torr.

2. The process of claim 1, wherein the substrate is of a material selected from the group consisting of steels and cemented carbides.

3. The process of claim 1, wherein the hard or chemically stable material is at least one compound of at least one element selected from the group consisting of Group IVa, Va and VIa elements of Periodic Table, silicon, aluminum and boron and at least one element selected from the group consisting of boron, carbon, nitrogen and oxygen.

4. The process of claim 1, wherein the high frequency source is selected from the group consisting of RF wave sources and microwave sources.

5. The process of claim 1, wherein the coating is carried out at a temperature of 300° to 1100° C.

* * * * *